United States Patent
Burroughes et al.

(10) Patent No.: US 8,686,632 B2
(45) Date of Patent: Apr. 1, 2014

(54) ORGANIC ELECTROLUMINESCENT DEVICE

(75) Inventors: Jeremy Burroughes, Cambridge (GB); Richard Wilson, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 13/634,347

(22) PCT Filed: Mar. 23, 2011

(86) PCT No.: PCT/GB2011/000408
§ 371 (c)(1),
(2), (4) Date: Nov. 13, 2012

(87) PCT Pub. No.: WO2011/117574
PCT Pub. Date: Sep. 29, 2011

(65) Prior Publication Data
US 2013/0049578 A1  Feb. 28, 2013

(30) Foreign Application Priority Data

Mar. 26, 2010 (GB) .................................. 1005124.1

(51) Int. Cl.
*H01L 51/52* (2006.01)
(52) U.S. Cl.
USPC .......................................................... 313/504
(58) Field of Classification Search
USPC .................................. 313/498–512
See application file for complete search history.

(56) References Cited

U.S. PATENT DOCUMENTS

| | | | |
|---|---|---|---|
| 4,539,507 A | 9/1985 | VanSlyke et al. | |
| 2003/0017360 A1 | 1/2003 | Tai et al. | |
| 2003/0227253 A1* | 12/2003 | Seo et al. | 313/504 |
| 2005/0236983 A1* | 10/2005 | Sakai et al. | 313/506 |
| 2006/0017380 A1 | 1/2006 | Fukunaga et al. | |
| 2006/0202611 A1* | 9/2006 | Hayashi | 313/504 |
| 2007/0080377 A1 | 4/2007 | Sung et al. | |
| 2007/0228937 A1* | 10/2007 | Akiyoshi | 313/503 |
| 2009/0322216 A1* | 12/2009 | Yanagihara | 313/504 |

FOREIGN PATENT DOCUMENTS

| | | |
|---|---|---|
| EP | 0 880 303 | 11/1998 |
| EP | 1 605 732 A1 | 4/2008 |
| GB | 2 197 126 A | 5/1988 |
| JP | 2007-010969 A | 1/2007 |

(Continued)

OTHER PUBLICATIONS

Great Britain Search Report for Application No. 1005124.1, dated Jul. 29, 2010.

(Continued)

*Primary Examiner* — Donald Raleigh
(74) *Attorney, Agent, or Firm* — Marshall, Gerstein & Borun LLP

(57) ABSTRACT

An organic electroluminescent device having a plurality of pixels, the device comprising: an anode formed on a substrate; an organic electroluminescent layer formed on the anode in each well of a well-defining layer to form the plurality of pixels; a cathode layer on the electroluminescent layer and a layer of metal on the top surface of the well-defining layer; wherein a conductive layer is deposited over the cathode layer and the metal layer to electrically connect the cathode layer on the electroluminescent layer with the metal layer on the top surface of the well-defining layer.

12 Claims, 4 Drawing Sheets

(56) References Cited

FOREIGN PATENT DOCUMENTS

| JP | 2007-227094 A | 9/2007 |
| WO | WO-90/13148 A1 | 11/1990 |
| WO | WO-95/06400 A1 | 3/1995 |
| WO | WO-99/21935 A1 | 5/1999 |
| WO | WO-99/48160 A1 | 9/1999 |
| WO | WO-01/56000 A3 | 12/2001 |
| WO | WO-02/067343 A1 | 8/2002 |

OTHER PUBLICATIONS

International Search Authority and Written Opinion for Application No. PCT/GB2011/000408, dated May 13, 2011.
International Preliminary Report on Patentability for Application No. PCT/GB2011/000408, dated Oct. 2, 2012.

* cited by examiner

ORGANIC ELECTROLUMINESCENT DEVICE

BACKGROUND OF THE INVENTION

1. Field of the Invention

The present invention relates, in general, to organic electroluminescent devices. More particularly, the present invention concerns an architecture for fabricating lighting panels including organic electroluminescent devices that provides current limitation in the event of a short.

2. Related Technology

Organic (which here includes organometallic) electroluminescent devices may be fabricated using polymers and/or small molecules in a range of colors, depending upon the materials used. Examples of polymer-based organic LEDs are described in WO 90/13148, WO 95/06400 and WO 99/48160; examples of small molecule based devices are described in U.S. Pat. No. 4,539,507 and examples of dendrimer-based materials are described in WO 99/21935 and WO 02/067343.

A basic structure 100 of a typical organic electroluminescent device is shown in FIG. 1. A glass or plastic substrate 102 supports a transparent anode layer 104 comprising, for example, indium tin oxide (ITO) on which is deposited a number of functional layers such as a hole transport layer 106 and an organic electroluminescent layer 108. A cathode 110 is deposited over the organic electroluminescent layer 108. The functional layers may be deposited by, for example, spin coating (afterwards removing material from unwanted areas by plasma etching or laser ablation) or by selective deposition such as inkjet printing. In this latter case banks 112 may be formed on the substrate, for example using photoresist, to define wells into which the organic layers may be deposited. Such wells define light emitting areas or pixels of the display.

Cathode layer 110 typically comprises a low workfunction layer immediately adjacent electroluminescent layer 108, such as a low work function metal such as calcium for improved electron energy level matching, and a high conductivity layer of a metal or alloy (such as for example aluminum). Additional sub-layers may also be included in the cathode layer, for example silver.

In the example shown in FIG. 1, to drive the device a voltage is applied across the anode 104 and cathode 110 represented by battery 118. Light 120 is emitted through transparent anode 104 and substrate 102 and such devices are referred to as "bottom emitters". Devices which emit through the cathode may also be constructed, for example, by keeping the thickness of cathode layer 110 less than around 50-100 nm so that the cathode is substantially transparent.

Organic light emitting devices have attracted increasing interest in recent years as lighting elements. In particular, in addition to lighting panels, such devices using commonly using white light emitting materials have potential applications to full color displays with the help of color filters, in backlights for liquid crystal displays (LCDs) and in solid-state lighting (SSL) devices.

An electroluminescent device as described in FIG. 1 and used as a lighting panel is preferably large area, but also extremely thin. A thin device of an order 100 to 200 nm thickness can have a very high capacitance causing a large charge to be stored during its operation.

The consequences of a short can be two-fold ranging from a loss of operation of the entire lighting panel to a discharge of charge through the short. The discharge of charge through the short can damage an individual pixel causing it to fail or emit light with different characteristics to the remaining pixels of the device meaning that the overall device produces a non-linear display.

Known solutions to preventing or at least mitigating shorts include a multi-stack device to make the electroluminescent device much thicker by additional layers or additional thickness of functional layers between and an anode and a cathode and so reduce the probability of shorts and the capacitance. Such an approach has a disadvantage of additional functional material and additional processing steps.

A further known solution is an approach described in WO/015600 in which an electroluminescent element is divided into sub-elements each with an individual fuse element.

According to WO/015600 an electroluminescent lighting element comprises four sub-elements in electrically parallel-arranged branches forming a pixel and, in each branch, an additional fuse element between one of the connections and a part of the layer of electroluminescent material. When a short circuit occurs between an anode and a cathode of one sub-element of a pixel, an associated fuse element is blown by a current peak in an associated current path. Accordingly the current is now spread across the remaining three sub-elements which continue to emit light so that the pixel continues to emit light.

WO/015600 requires additional fuse elements to be provided in any fabrication step, which has the disadvantage of increasing processing times and fabrication steps, such additional steps which can increase the likelihood of a short. Moreover, in the event of a short one sub-element is removed from the luminescence of a pixel and depending upon the area of each sub-element can cause the overall pixel to display large non-linear luminescence characteristics.

SUMMARY OF THE INVENTION

Accordingly, the present invention seeks to provide a device capable of mitigating the effect of a short circuit on an electroluminescent device whilst being economic in terms of fabrication and material overheads.

In a first aspect of the present invention, there is provided an organic electroluminescent device having a plurality of pixels, the device comprising: an anode formed on a substrate; an organic electroluminescent layer formed on the anode in each well of a well-defining layer to form the plurality of pixels; a cathode layer on the electroluminescent layer and a layer of metal on the top surface of the well-defining layer; wherein a conductive layer is deposited over the cathode layer and the metal layer for connecting the cathode layer on the electroluminescent layer with the metal layer on the top surface of the well-defining layer.

BRIEF DESCRIPTION OF THE DRAWINGS

Embodiments of the present invention will now be described, by way of example only, and with reference to the accompanying drawings of which.

DETAILED DESCRIPTION

Figure 1:
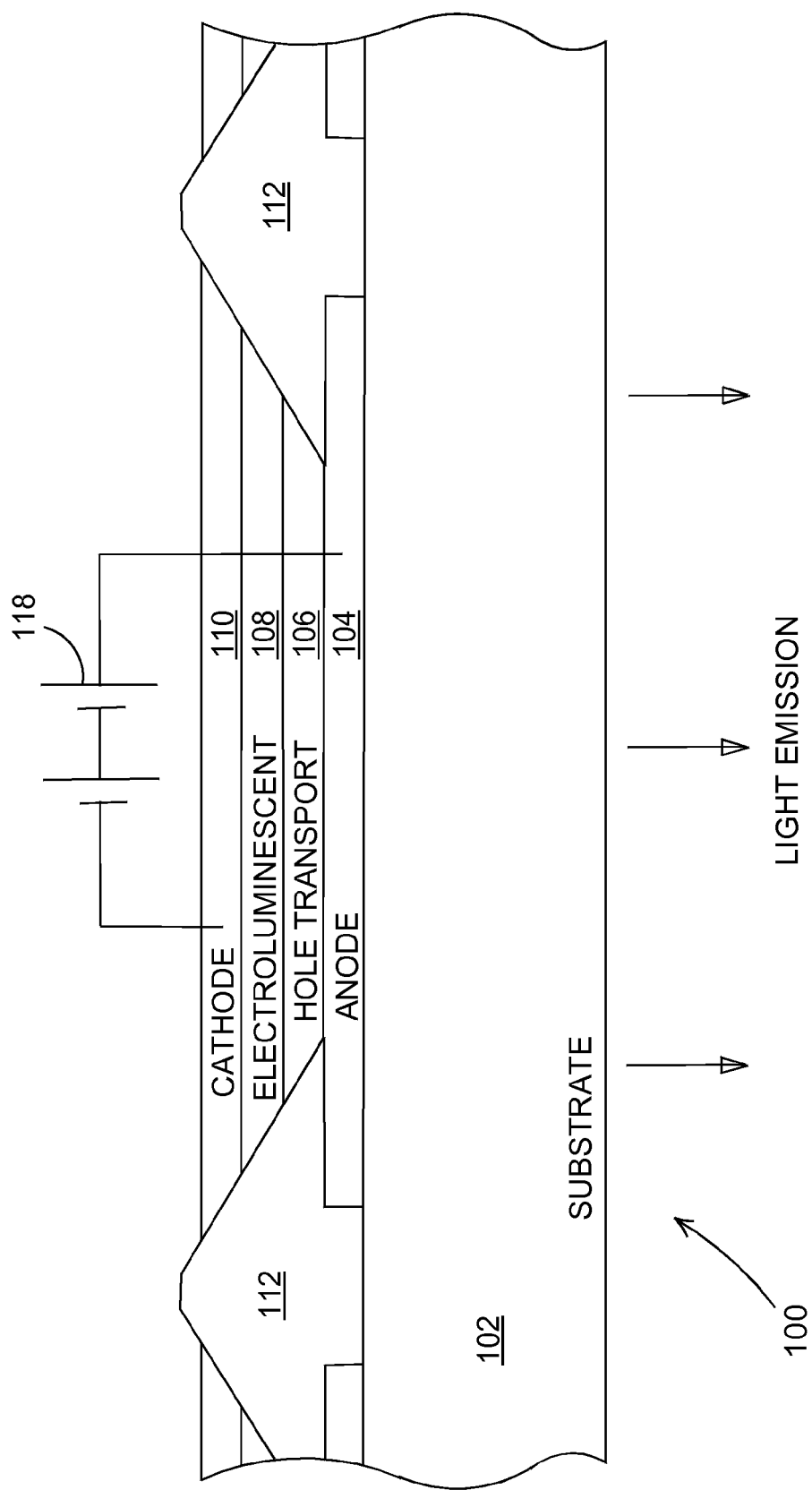
FIG. 1 is a schematic diagram of a bottom-emitting organic light emitting device according the prior art.

Throughout the following description like reference numerals shall be used to designate like parts.

Figure 2:
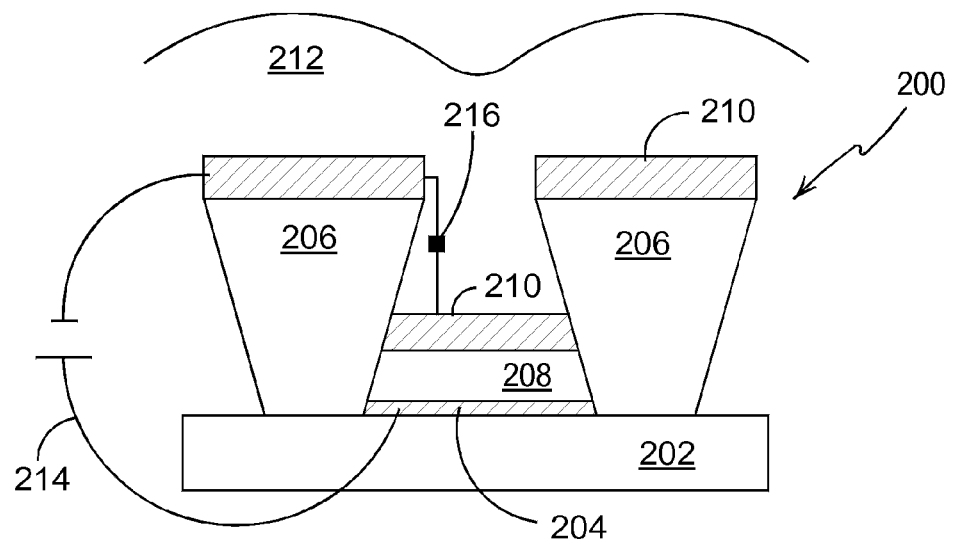
FIG. 2 is a schematic diagram of an organic light emitting device according to a first embodiment of the present invention.

Referring to FIG. 2, a first embodiment of the present invention provides an organic electroluminescent device 200 comprising a transparent glass substrate 202 having deposited thereon a transparent patterned anode electrode layer 204 of indium tin oxide. A patterned well-forming resist layer comprising polyimide provides a pair of cathode separators 206 on the substrate 202. The pair of cathode separators 206 has an overhung cross section being trapezoidal with a side on the substrate 202 being shorter than a side remote from the substrate 202.

Electroluminescent material 208 is deposited into a well formed by the pair of cathode separators 206 and a cathode electrode layer 210 of metal, in this case a low work function metal such as barium, is deposited on the electroluminescent material 208 and on the surface of each cathode separator 206. Due to the arrangement of the cathode separator 206, the cathode electrode layer 210 is broken such that there is not a physical connection between a cathode metal on the electroluminescent material 208 and the cathode metal on the surface of the cathode separator 206. A conductive layer 212, for example a metal-oxide such as zinc oxide is deposited over the cathode layer 210.

The resistivity required of the conductive layer 212 is dependent on the properties of the organic electroluminescent device 200 and in particular by the properties of the electroluminescent material 208. For example, the area of the electroluminescent device 200 and the thickness of the electroluminescent material 208 are taken into account. It is helpful to refer to the resistivity required in terms of a ratio of resistance dependent on the area of the electroluminescent device 200 and the resistance of the short-protection conductive layer 212. The ratio of the resistances will vary depending upon how many electroluminescent devices 200 are driven in parallel and how much current is desired to flow through non-shorted electroluminescent devices 200 when one shorts. Such ratios of resistance of the organic electroluminescent material 208 at operating condition to the resistance of the conductive layer 212 are in a range of around 10:1 to 100:1.

In operation, as illustrated generally and schematically by the electrical connection 214 a voltage is applied across the device 200 from anode electrode layer 204 to cathode electrode layer 206. The current flows from the cathode metal on the surface of the cathode separator 206 through the conductive layer 212 to the cathode metal on the electroluminescent material 208.

Figure 3:
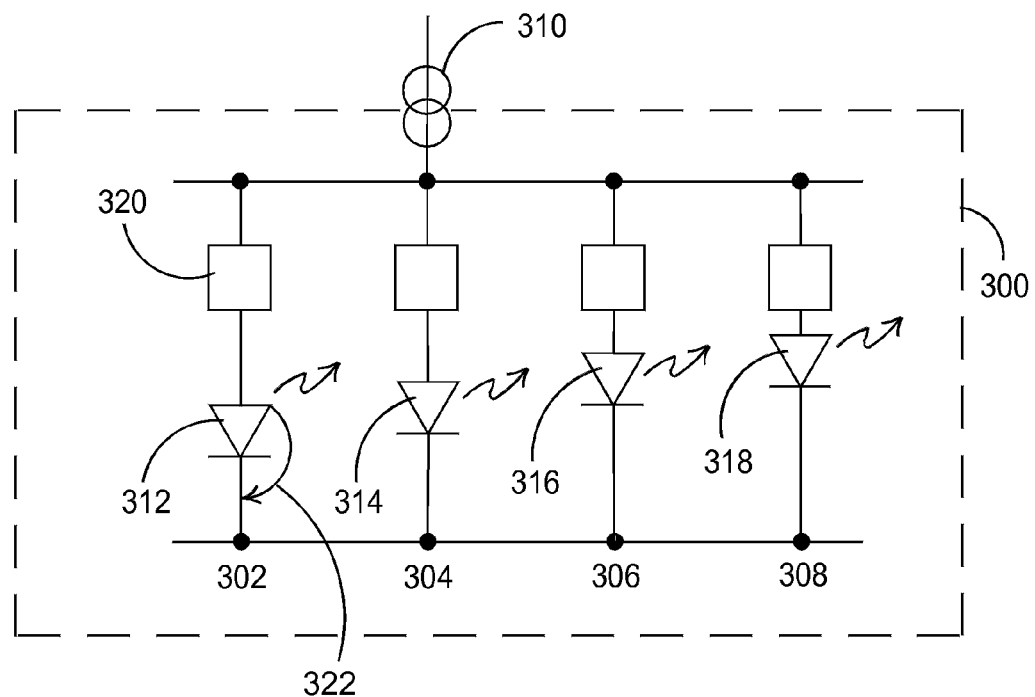
FIG. 3 is an equivalent circuit diagram of a number of organic light emitting devices of FIG. 2.

As best seen in FIG. 3, a lighting element 300 comprising of four white light emitting electroluminescent pixels 302, 304, 306 and 308 are shown in a parallel arrangement driven by a current source 310. Each electroluminescent pixel 302, 304, 306 and 308 comprise an organic light emitting diode 312, 314, 316 and 318 respectively and a connection resistance 320 to represent the conductive layer 212. The connection resistance 320 is chosen to be lower than the differential resistance of the organic light emitting diode 312-318 at operating point throughout its lifetime, but sufficiently high that in the event of a short it acts to limit current flow to the short, ensuring that the lighting element 300 remains operational.

In FIG. 3, the organic light emitting diode 312 is illustrated as having developed a short circuit 322. In operation, the resistance 320 acts to limit current flow to the short thereby ensuring that the lighting element 300 remains operational.

Figure 4:
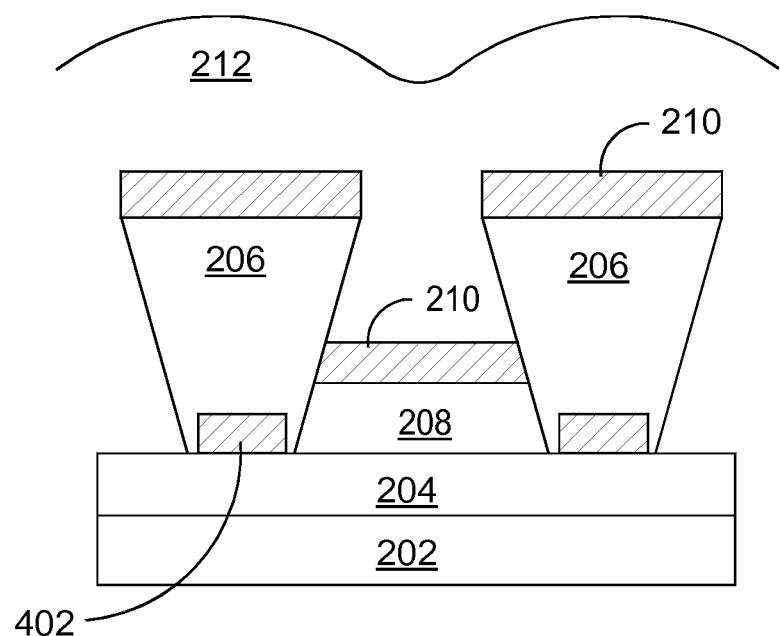
FIG. 4 is a schematic diagram of an organic light emitting device according to a second embodiment of the present invention.

FIG. 4 is a schematic diagram of an organic light emitting device according to a second embodiment of the present invention. According to FIG. 4, an anode grid metal 402 is connected to the anode electrode layer 204 of indium tin oxide to minimize anode voltage drops.

Figure 5:
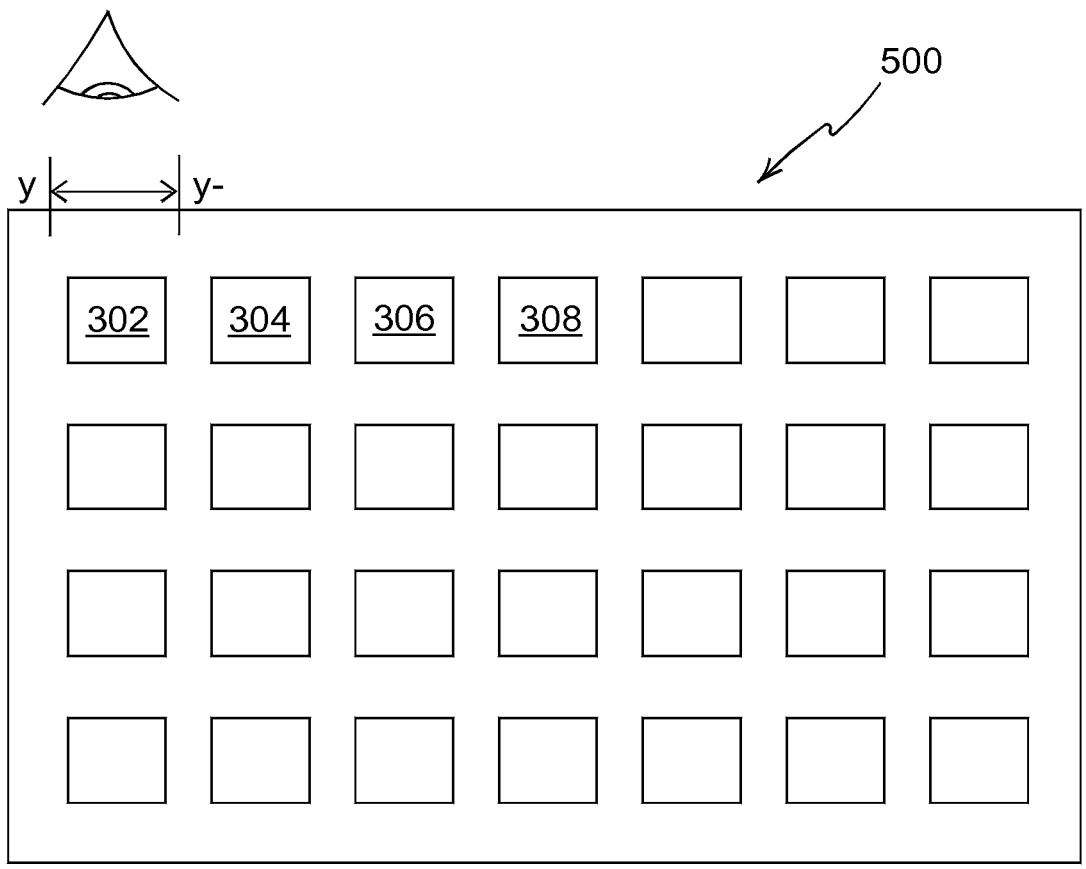
FIG. 5 is a plan view of organic light emitting devices (in part of a lighting panel) according to the present invention.

FIG. 5 is a plan view of organic light emitting devices (in part of a lighting panel 500) according to the present invention. A lighting panel 500 comprises an array of organic electroluminescent pixels 302-308 as viewed along cross-section y-y in FIGS. 2 and 4.

Several variations are possible within the scope of the invention. In a variation of the present invention, the layer of metal on the top surface of the well-defining layer is a separate metal layer to the cathode layer and provides bus-bars that are able to enhance the conductivity of the device. The metal on the top surface may be any metal having suitable conductivity, and suitable examples will be readily apparent to those skilled in the field. Preferred examples include aluminum, silver and chromium. The metal may be deposited on the top surfaces of the well-defining layer by means apparent to those skilled in the field. For example, the metal may be deposited by thermal evaporation. Typically, the thickness of this layer is 0.1-1 µm.

In another preferred embodiment of the present invention, the layer of metal on the top surface of the well-defining layer is the same metal layer as the cathode layer in that the cathode layer is deposited so that it is disposed on both the electroluminescent layer and on the top surface of the well-defining layer. In this case, the well-defining layer is a cathode separator so that there is breakage between the cathode layer on the electroluminescent layer and the cathode layer on the top surface of the well-defining layer. The cathode separator can be provided by the shape of the well-defining layer as is known to those skilled in the field. For example, the walls of the well-defining layer may have a negative profile such that the angle between the perpendicular to the substrate and the walls is less than 0 degrees.

Figure 6:
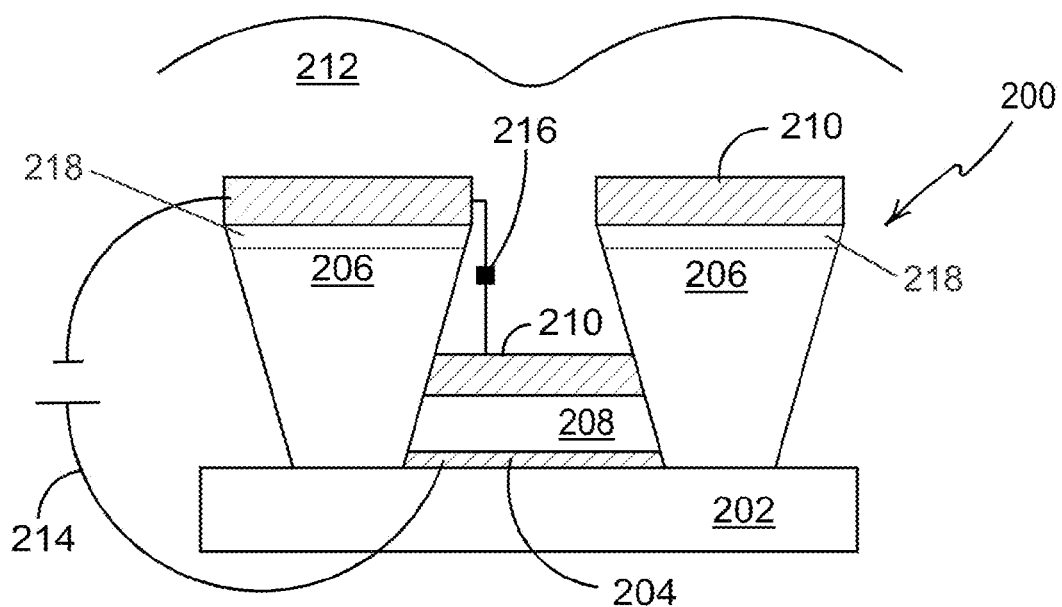
FIG. 6 is a schematic diagram of an organic light emitting device according to a first embodiment of the present invention.

Alternatively, the layer of metal is retained on the top surface of the well-defining layer and the cathode layer is deposited such that it is formed both on the electroluminescent layer and the layer of metal on the top surface of the well-defining layer. FIG. 6 shows such a configuration in which the cathode layer 210 is deposited on the layer of metal on the top surface of the well defining layer 218.

The well defining layer may be formed from a photoresist patterned using a suitable photomask. Alternatively, the well defining layer may be an etchable material, in particular and etchable polyimide, that may be patterned to form the well-defining layer by a wet etch or a dry etch process. Where the well-defining layer is a photoresist layer, it may be formed from any photoresist material, examples of which include photosensitive polyimides and the like (see, for example, EP-A-0880303). Preferably, the photoresist used is a positive photoresist.

Materials for the conductive layer include metal oxides such as zinc oxide, molybdenum oxide, tungsten oxide, doped organic transport materials or synthetic metals such as a conductive polymer poly(ethylene dioxythiophene) (PEDOT), doped electron transport layers, or un-doped organic conducting materials, such as conjugated polymers, pendant polymers and small molecules.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. An organic electroluminescent device having a plurality of pixels, the device comprising:
   an anode formed on a substrate;
   an organic electroluminescent layer formed on the anode in each well of a well-defining layer to form the plurality of pixels; and,
   a cathode layer on the electroluminescent layer and a layer of metal on the top surface of the well-defining layer;
   wherein the device further includes a conductive layer deposited over the cathode layer and the metal layer to electrically connect the cathode layer of each of the plurality of pixels with the metal layer, wherein the plurality of pixels are arranged in a parallel arrangement, and wherein a ratio of a resistance of the conductive layer to a resistance of the organic electroluminescent layer at operating condition is in the range 1:10 to 1:100, such that the conductive layer provides a current limitation in the event of a short circuit of any one of the pixels.

2. An organic electroluminescent device as claimed in claim 1, wherein the layer of metal on the top surface of the well-defining layer is the same metal layer as the cathode layer.

3. An organic electroluminescent device as claimed in 1, wherein the cathode layer is deposited such that is formed both on the metal layer on the top surface of the well-defining layer and on the electroluminescent layer.

4. An organic electroluminescent device as claimed in claim 1, wherein the conductive layer comprises a metal oxide.

5. An organic electroluminescent device as claimed in claim 4, wherein the metal oxide is selected from the group consisting of zinc oxide, molybdenum oxide, and tungsten oxide.

6. An organic electroluminescent device as claimed in claim 1, wherein the conductive layer comprises a conductive polymer.

7. An organic electroluminescent device as claimed in claim 1, wherein the organic electroluminescent layer is a layer deposited by inkjet printing, slot-coating, capillary printing, gravure printing, or screen printing.

8. An organic electroluminescent device as claimed in claim 1, wherein the well-defining layer is formed from a photoresist patterned using a suitable photomask.

9. An organic electroluminescent device as claimed in claim 1, wherein the well-defining layer is formed from an etchable material patterned to firm the well-defining layer by a wet etch or dry etch process.

10. An organic electroluminescent device as claimed in claim 1, wherein the walls of the well-defining layer comprise an overhanging profile.

11. A lighting panel comprising an array of organic electroluminescent devices as claimed in claim 1.

12. A lighting panel as claimed in claim 11, wherein the organic electroluminescent device comprises a thickness measured from anode to cathode layer of 100 nm to 200 nm.

* * * * *